US009419251B2

(12) United States Patent
Tian et al.

(10) Patent No.: US 9,419,251 B2
(45) Date of Patent: Aug. 16, 2016

(54) DISPLAY DEVICE AND METHOD OF MANUFACTURING THE SAME

(71) Applicant: BOE TECHNOLOGY GROUP CO., LTD., Beijing (CN)

(72) Inventors: Yunyun Tian, Beijing (CN); Choi Hyun Sic, Beijing (CN); Qiangtao Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/435,966

(22) PCT Filed: Apr. 24, 2014

(86) PCT No.: PCT/CN2014/076132
§ 371 (c)(1),
(2) Date: Apr. 15, 2015

(87) PCT Pub. No.: WO2015/113331
PCT Pub. Date: Aug. 6, 2015

(65) Prior Publication Data
US 2016/0028046 A1  Jan. 28, 2016

(30) Foreign Application Priority Data

Jan. 28, 2014 (CN) .......................... 2014 1 0041270

(51) Int. Cl.
*H01L 21/00* (2006.01)
*H01L 51/52* (2006.01)
(Continued)

(52) U.S. Cl.
CPC ........ *H01L 51/5284* (2013.01); *H01L 51/5237* (2013.01); *H01L 51/5262* (2013.01);
(Continued)

(58) Field of Classification Search
CPC .. H01L 51/5284; H01L 51/5281; H01L 51/56
See application file for complete search history.

(56) References Cited

U.S. PATENT DOCUMENTS 8,330,172 B2 * 12/2012 Choi ................... H01L 27/3246
257/59
8,481,998 B2 * 7/2013 Cho ..................... H01L 27/1248
257/100
(Continued)

FOREIGN PATENT DOCUMENTS

CN  101589648 A  11/2009
CN  102916034 A  2/2013
(Continued)

OTHER PUBLICATIONS

Second Chinese Office Action, including English translation, dated Mar. 30, 2016, for corresponding Chinese Application No. 201410041270.7.
(Continued)

*Primary Examiner* — Laura Menz
(74) *Attorney, Agent, or Firm* — Kinney & Lange, P.A.

(57) ABSTRACT

The present invention discloses a display device and a method of manufacturing the display device to solve a problem in the prior art that the light transmittance of the displaying light in the display device is very low. In the present invention, the display device comprises a first substrate formed with at least one metal pattern thereon, a second substrate disposed opposite to the first substrate, and a polarizer provided on an outer side of the second substrate far away from the first substrate. An area of an overlapping region between the metal pattern and a pixel display zone is less than an area of the pixel display zone. The polarizer comprises a light absorption layer fully covering the at least one metal pattern. An area of an overlapping region between the light absorption layer of the polarizer and the pixel display zone is less than the area of the pixel display zone. In the present invention, it increases the light transmittance of the displaying light in the OLED display device.

20 Claims, 3 Drawing Sheets

(51) Int. Cl.
*H01L 51/56* (2006.01)
*H01L 27/32* (2006.01)

(52) U.S. Cl.
CPC ............ *H01L51/5281* (2013.01); *H01L 51/56* (2013.01); *H01L 27/3244* (2013.01); *H01L 51/524* (2013.01); *H01L 2251/5315* (2013.01)

(56) References Cited

U.S. PATENT DOCUMENTS

| | | | | |
|---|---|---|---|---|
| 8,698,146 | B2* | 4/2014 | Moon | H01L 27/3262 257/40 |
| 8,736,546 | B2* | 5/2014 | Oh | H01L 27/3232 345/107 |
| 9,093,660 | B2* | 7/2015 | Yang | H01L 51/5221 |
| 9,128,338 | B2* | 9/2015 | Yim | G02F 1/1362 |
| 9,159,958 | B2* | 10/2015 | Jeon | G02B 5/3016 |
| 2003/0127656 | A1* | 7/2003 | Aizawa | H01L 51/5281 257/79 |
| 2005/0035353 | A1* | 2/2005 | Adachi | H01L 27/12 257/72 |
| 2005/0264731 | A1 | 12/2005 | Itou et al. | |
| 2010/0026938 | A1* | 2/2010 | Hattori | G02F 1/133345 349/96 |
| 2010/0182552 | A1* | 7/2010 | Park | H01L 51/5281 349/114 |
| 2011/0128476 | A1 | 6/2011 | Park et al. | |
| 2014/0036200 | A1* | 2/2014 | Jung | G02F 1/133536 349/61 |
| 2015/0060778 | A1* | 3/2015 | Kim | H01L 27/3258 257/40 |
| 2015/0333297 | A1* | 11/2015 | Liu | H01L 51/0097 257/40 |
| 2016/0028046 | A1* | 1/2016 | Tian | H01L 51/5262 257/40 |
| 2016/0049614 | A1* | 2/2016 | Gao | H01L 51/0097 257/40 |

FOREIGN PATENT DOCUMENTS

| | | | | |
|---|---|---|---|---|
| CN | 203707189 U | | 7/2014 | |
| KR | 2493417 A | * | 2/2013 | ........... G02B 5/3041 |
| WO | 2013039072 A1 | | 3/2013 | |

OTHER PUBLICATIONS

English translation of Written Opinion dated Oct. 20, 2014, for corresponding PCT Application No. PCT/CN2014/076132.
Chinese Office Action (and English translation) dated Dec. 3, 2015, for corresponding Chinese Application No. 201410041270.7.
International Search Report in Chinese dated Oct. 13, 2014, for corresponding PCT Application No. PCT/CN2014/076132.
Written Opinion in Chinese dated Oct. 27, 2014, for corresponding PCT Application No. PCT/CN2014/076132.

* cited by examiner

DISPLAY DEVICE AND METHOD OF MANUFACTURING THE SAME

BACKGROUND OF THE INVENTION

1. Field of the Invention

The present invention relates to a display technical field, more particularly, relates to a display device and a method of manufacturing the display device.

2. Description of the Related Art

Compared with a liquid crystal display device, an Organic Light-Emitting Diode (OLED) display device, as a new-style display device, has many advantages, such as, self-luminescence, high response speed, wide visual angle, and so on. Moreover, the OLED display device also may achieve flexible display, transparent display and 3D display. Thereby, the OLED display device is rapidly developed and widely popularized.

The OLED display device comprises a metal member therein. Since the metal member has a strong reflection coefficient, an external light directed to the metal member is mostly reflected off, causing a negative influence on display effect of the OLED display device.

In order to decrease the negative influence of the external light on the display effect of the OLED display device, as shown in FIG. 1, in the prior art, a wave plate 14 and a polarizer 16 comprising a light absorption layer (for example, Polyvinyl Alcohol (PVA) layer) 16A are sequentially disposed and laminated on whole surface of a second substrate 13 in the OLED display device. Hereafter, it will briefly describe a principle of decreasing the negative influence on display effect of the OLED display device by absorbing the external light with the light absorption layer by taking an example where the polarizer is a vertical polarizer, and the wave plate comprises a $\lambda/2$-wave plate and a $\lambda/4$-wave plate. In this example, the external light is firstly converted into a vertical polarized light after passing through the vertical polarizer; then, the vertical polarized light is converted into a left circularly polarized light after passing through the $\lambda/2$-wave plate and the $\lambda/4$-wave plate; then, the left circularly polarized light is converted into a right circularly polarized light after being reflected by the metal member; then, the right circularly polarized light is converted into a horizontally polarized light after passing through the $\lambda/2$-wave plate and the $\lambda/4$-wave plate; finally, the horizontally polarized light cannot passing through the vertical polarizer and is absorbed by the light absorption layer.

In the prior art, since the wave plate and the polarizer comprising the light absorption layer are sequentially disposed and laminated on the whole surface of the second substrate in the OLED display device, a displaying light in the OLED display device needs to sequentially pass through the wave plate and the polarizer, and a part of the displaying light is lost due to the wave plate, and also, most of the displaying light is absorbed by the light absorption layer of the polarizer, thereby reducing the light transmittance of the displaying light.

In sum, in the prior art, since the wave plate and the polarizer comprising the light absorption layer are sequentially disposed and laminated on the whole surface of the second substrate in the OLED display device, the light transmittance of the displaying light becomes very low.

SUMMARY OF THE INVENTION

The present invention has been made to overcome or alleviate at least one aspect of the above mentioned disadvantages.

The present invention provides a display device and a method of manufacturing the display device to solve a problem in the prior art that the light transmittance of the displaying light in the display device is very low.

According to an aspect of the present invention, there is provided a display device comprising:

a first substrate formed with at least one metal pattern thereon;

a second substrate disposed opposite to the first substrate; and a polarizer provided on an outer side of the second substrate far away from the first substrate, wherein an area of an overlapping region between the metal pattern and a pixel display zone is less than an area of the pixel display zone, wherein the polarizer comprises a light absorption layer fully covering the at least one metal pattern, and wherein an area of an overlapping region between the light absorption layer of the polarizer and the pixel display zone is less than the area of the pixel display zone.

According to an exemplary embodiment of the present invention, the display device comprises a wave plate disposed on the outer side or an inner side of the second substrate and located below the polarizer.

According to another exemplary embodiment of the present invention, the wave plate fully covers the at least one metal pattern, and the polarizer fully covers the wave plate; and an area of an overlapping region between the wave plate and the pixel display zone is less than the area of the pixel display zone.

According to another exemplary embodiment of the present invention, the wave plate is disposed on the inner side of the second substrate, and the display device further comprises a planarization layer for packaging the wave plate.

According to another exemplary embodiment of the present invention, the wave plate comprises $\lambda/2$-wave plate and $\lambda/4$-wave plate.

According to another exemplary embodiment of the present invention, the light absorption layer is made of polyvinyl alcohol.

According to another exemplary embodiment of the present invention, the polarizer further comprises a cellulose triacetate layer completely coincided with the light absorption layer.

According to another exemplary embodiment of the present invention, the metal pattern comprises at least one of gate lines, data lines, gate electrodes, source electrodes and drain electrodes.

According to another exemplary embodiment of the present invention, the display device has a pixel size less than a preset size threshold, and the light absorption layer is not overlapped with the pixel display zone.

According to another exemplary embodiment of the present invention, the display device comprises an Organic Light-Emitting Diode (OLED) display device.

According to another exemplary embodiment of the present invention, the metal pattern is not overlapped with the pixel display zone, partly overlapped with the pixel display zone, or completely overlapped with the pixel display zone.

According to another exemplary embodiment of the present invention, the metal pattern is completely overlapped with the pixel display zone, and an area of the metal pattern is less than the area of the pixel display zone.

According to another exemplary embodiment of the present invention, the light absorption layer of the polarizer is not overlapped with the pixel display zone, partly overlapped with the pixel display zone, or completely overlapped with the pixel display zone.

According to another exemplary embodiment of the present invention, the light absorption layer of the polarizer is completely overlapped with the pixel display zone, and an area of the light absorption layer of the polarizer is less than the area of the pixel display zone.

According to another aspect of the present invention, there is provided a method of manufacturing a display device, comprising steps of:

forming at least one metal pattern on a first substrate, wherein an area of an overlapping region between the metal pattern and a pixel display zone is less than an area of the pixel display zone;

forming a polarizer on an outer side of a second substrate far away from the first substrate, wherein the polarizer comprises a light absorption layer; and assembling the first substrate and the second substrate together, so that the light absorption layer fully covers the at least one metal pattern, wherein an area of an overlapping region between the light absorption layer and the pixel display zone is less than the area of the pixel display zone.

According to an exemplary embodiment of the present invention, the above method further comprising: forming a wave plate dispose on an inner side of the second substrate, so that the wave plate fully covers the at least one metal pattern, and the polarizer fully covers the wave plate, after the first substrate and the second substrate are assembled together, wherein an area of an overlapping region between the wave plate and the pixel display zone is less than the area of the pixel display zone.

According to another exemplary embodiment of the present invention, the above method further comprising: forming a planarization layer for packaging the wave plate after forming the wave plate.

According to another exemplary embodiment of the present invention, in the above method, the wave plate comprises $\lambda/2$-wave plate and $\lambda/4$-wave plate.

According to another exemplary embodiment of the present invention, in the above method, the metal pattern comprises at least one of gate lines, data lines, gate electrodes, source electrodes and drain electrodes.

According to another exemplary embodiment of the present invention, in the above method, the display device comprises an Organic Light-Emitting Diode (OLED) display device.

In the embodiments of the present invention, the light absorption layer contained in the polarizer fully covers the at least one metal pattern, it is possible to decrease the negative influence of the external light on display effect of the OLED display device, compared with the prior art. Furthermore, the area of the overlapping region between the light absorption layer and the pixel display zone is less than the area of the pixel display zone. Thereby, the displaying light has high light transmittance in a region of the pixel display zone which is not overlapped with the light absorption layer, increasing the light transmittance of the displaying light in the OLED display device.

DETAILED DESCRIPTION OF PREFERRED EMBODIMENTS OF THE INVENTION

Figure 1:
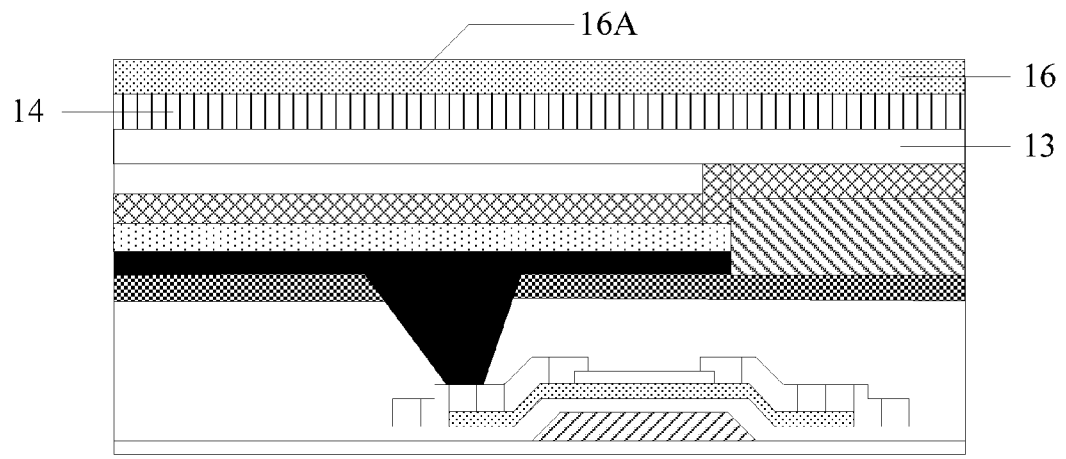
FIG. 1 is a cross section view of an OLED display device in the prior art.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein. These embodiments are provided with reference to the drawings, so that the present disclosure will be thorough and complete, and will fully convey the concept of the disclosure to those skilled in the art.

According to a general concept of the present invention, there is provided a display device, comprising: a first substrate formed with at least one metal pattern thereon; a second substrate disposed opposite to the first substrate; and a polarizer provided on an outer side of the second substrate far away from the first substrate, wherein an area of an overlapping region between the metal pattern and a pixel display zone is less than an area of the pixel display zone, wherein the polarizer comprises a light absorption layer fully covering the at least one metal pattern, and wherein an area of an overlapping region between the light absorption layer and the pixel display zone is less than the area of the pixel display zone.

Since the light absorption layer contained in the polarizer fully covers the at least one metal pattern, it is sure of decreasing the negative influence of the external light on display effect of the OLED display device. Furthermore, the area of the overlapping region between the light absorption layer and the pixel display zone is less than the area of the pixel display zone. Thereby, displaying light in the OLED display device has high light transmittance in a region of the pixel display zone where is not overlapped with the light absorption layer, thereby increasing the light transmittance of the displaying light.

Hereafter, it will further describe in detail embodiments of the present invention with reference to drawings.

Preferably, in an embodiment of the present invention, the display device comprises a first substrate and a second substrate disposed opposite to each other. The first substrate is formed with at least one metal pattern thereon, and an area of an overlapping region between the metal pattern and a pixel display zone is less than an area of the pixel display zone. Also, the display device further comprises a polarizer provided on an outer side of the second substrate far away from the first substrate.

The polarizer comprises a light absorption layer fully covering the at least one metal pattern, and an area of an overlapping region between the light absorption layer and the pixel display zone is less than the area of the pixel display zone.

In practical application, taking the OLED display device as an example, an covering region of a pattern of the light absorption layer made of light absorption material in the polarizer is controlled, so that the light absorption layer may absorb an external light reflected by the metal pattern, so as to decrease the negative influence of the external light on display effect of the OLED display device. Furthermore, the light absorption layer is arranged not to shield the whole pixel display zone, so that the displaying light has high light transmittance in a region of the pixel display zone where is not overlapped with the light absorption layer, increasing the light transmittance of the displaying light in the OLED display device. That is, in the embodiments of the present invention, it not only decreases the negative influence of the external light on display effect of the OLED display device, but also increases the light transmittance of the displaying light in the OLED display device (that is, increases pixel transmittance).

Preferably, in an embodiment of the present invention, the metal pattern may be any metal pattern in the array substrate of the display device as long as it satisfies following condition: the area of the overlapping region between the metal pattern and the pixel display zone is less than the area of the pixel display zone.

Preferably, in an embodiment of the present invention, the metal pattern comprises metal lines, metal electrodes and metal film layers.

Preferably, in an embodiment of the present invention, the metal pattern comprises at least one of gate lines, data lines, gate electrodes, source electrodes and drain electrodes.

Please be noted that the gate lines and the data lines intersected with each other and insulated from each other in the array substrate are arranged to define a plurality of pixels. A zone corresponding to each of the defined pixels may be divided into a display zone and a non-display zone. In an embodiment of the present invention, the pixel display zone is a zone of the pixel for displaying, that is, a transmission zone of the pixel.

Figure 2:
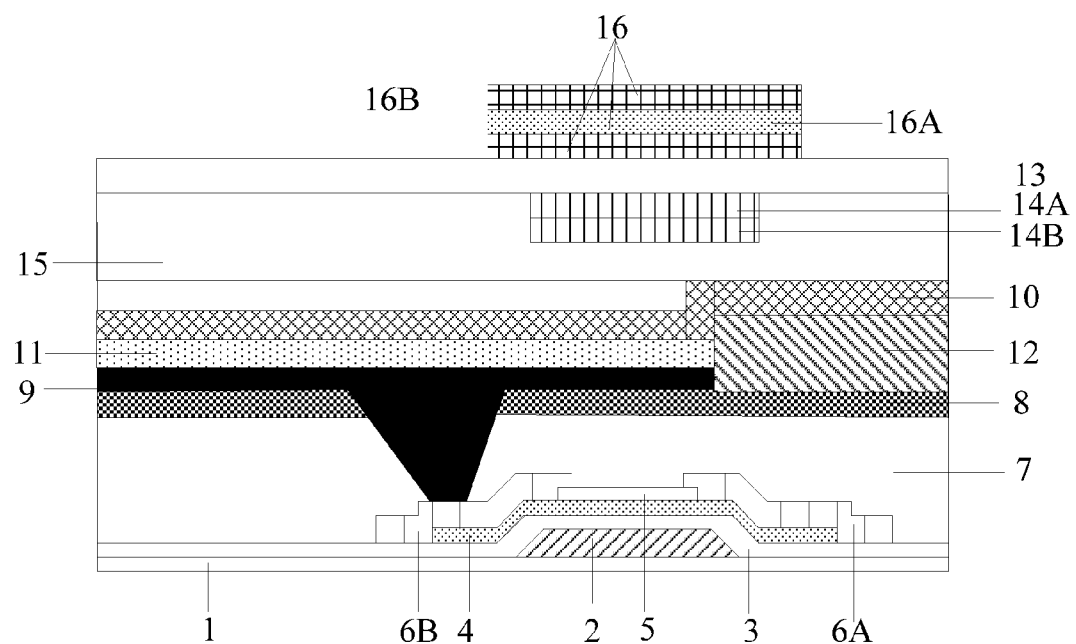
FIG. 2 is a cross section view of an OLED display device according to an exemplary embodiment of the present invention.

For example, taking the OLED display device as an example, as shown in FIG. 2, each pixel in the array substrate comprises an organic light emitting layer 11 and a pixel definition layer (PDL) 12 provided in the same layer as the organic light emitting layer 11. The pixel display zone of the OLED display device is a zone corresponding to the organic light emitting layer 11 between adjacent two PDLs 12.

Preferably, an area of an overlapping region between each metal pattern on the first substrate and the pixel display zone is less than the area of the pixel display zone.

Preferably, when the area of the overlapping region between the metal pattern and the pixel display zone is less than the area of the pixel display zone, the metal pattern and the pixel display zone may have following three kinds of position relations:

1. The metal pattern is overlapped with the pixel display zone;
2. The metal pattern is partly overlapped with the pixel display zone;
3. The metal pattern is completely overlapped with the pixel display zone, and the area of the metal pattern is less than the area of the pixel display zone.

Hereafter, it will describe the present according to an embodiment where the light absorption layer fully covers the at least one metal pattern.

1. The light absorption layer fully covers all metal patterns.

Preferably, the area of the overlapping region between all metal patterns and the pixel display zone is less than the area of the pixel display zone, and the light absorption layer fully covers all metal patterns.

In practical application, it is sure of decreasing the negative influence of the external light on display effect of the OLED display device, and increasing the light transmittance of the displaying light in the OLED display device.

In practical application, in a case where the area of the overlapping region between all metal patterns and the pixel display zone is less than the area of the pixel display zone, the light absorption layer may fully covers a part of the metal patterns.

2. The light absorption layer fully covers a part of the metal patterns.

Preferably, if the metal pattern and the pixel display zone does not satisfy following condition: the area of the overlapping region between all metal patterns and the pixel display zone is less than the area of the pixel display zone, the light absorption layer may also fully covers a part of the metal patterns.

In practical application, it is sure of decreasing the negative influence of the external light on display effect of the OLED display device, and increasing the light transmittance of the displaying light in the OLED display device.

Preferably, in a case where the area of the overlapping region between the light absorption layer and the pixel display zone is less than the area of the pixel display zone, the light absorption layer and the pixel display zone may have following three kinds of position relations:

(1) The light absorption layer is not overlapped with the pixel display zone;
(2) The light absorption layer is partly overlapped with the pixel display zone;
(3) The light absorption layer is completely overlapped with the pixel display zone, and the area of the light absorption layer is less than the area of the pixel display zone.

Preferably, the polarizer further comprises a cellulose triacetate (TAC) layer completely coincided with the light absorption layer.

In practical application, it is able to increase the light transmittance of the displaying light in the OLED display device.

In practical application, the TAC layer may be arranged to be not completely coincide with the light absorption layer.

Preferably, the display device comprises a wave plate disposed on the outer side or an inner side of the second substrate and located below the polarizer.

Preferably, in a case where the wave plate is disposed on the inner side of the second substrate, the display device further comprises a planarization layer for packaging the wave plate.

In practical application, the planarization layer may flat the inner side surface of the second substrate.

In practical application, the wave plate may be integrated with the polarizer and used as a film layer contained in the polarizer.

Preferably, the the wave plate fully covers the at least one metal pattern, and the polarizer fully covers the wave plate; and an area of an overlapping region between the wave plate and the pixel display zone is less than the area of the pixel display zone.

In practical application, a covering region of a pattern of the wave plate is controlled to decrease the negative influence of the external light on display effect of the OLED display device, and increase the light transmittance of the displaying light in the OLED display device.

In practical application, in an embodiment of the present invention, the embodiment where the wave plate fully covers the at least one metal pattern may be similar as the embodiment where the light absorption layer fully covers the at least one metal pattern, and its description is omitted herein.

In practical application, in an embodiment of the present invention, the embodiment where the area of the overlapping region between the wave plate and the pixel display zone is less than the area of the pixel display zone may be similar as the embodiment where the area of the overlapping region between the light absorption layer and the pixel display zone is less than the area of the pixel display zone, and its description is omitted herein.

In practical application, the polarizer may be arranged not to fully cover the wave plate, for example, the wave plate is fully overlapped with the polarizer, and the area of the wave plate is larger than the area of the polarizer; or the wave plate is arranged to completely coincide with the polarizer.

Preferably, in an embodiment of the present invention, the wave plate comprises λ/2-wave plate and λ/4-wave plate.

Preferably, an crystal axis of the λ/2-wave plate is set as 15 degrees, and an crystal axis of the λ/4-wave plate is set as 75 degrees.

In practical application, in an embodiment of the present invention, the λ/2-wave plate may be located above or below the λ/4-wave plate.

In practical application, in an embodiment of the present invention, the wave plate may cooperate with the polarizer to decrease the negative influence of the external light on display effect of the OLED display device.

Please be noted that the wave plate in an embodiment of the present invention may be other type of wave plate or wave plate set as long as it is capable of cooperating with the polarizer to decrease the negative influence of the external light on display effect of the OLED display device.

Preferably, in a case where the display device has a pixel size less than a preset size threshold, and the light absorption layer is not overlapped with the pixel display zone.

In practical application, as for high resolution display device, since its pixel size is relatively small, when the light absorption layer is not overlapped with the pixel display zone, it has high light transmission.

In practical application, the preset size threshold may be depended on practical requirement, experience or specific application condition.

Preferably, the display device may be an Organic Light-Emitting Diode (OLED) display device.

Hereafter, it will describe the structure of the OLED display device according to an embodiment of the present invention.

First Embodiment

As shown in FIG. 2, the OLED display device comprises a first substrate 1, a gate electrode 2 provided on the first substrate 1, a gate insulation layer 3 provided on the first substrate 1 and fully covering the gate electrode 2, an active layer 4 provided on the gate insulation layer 3, an etch stop layer (ESL) 5 provided on the active layer 4, a source electrode 6A and a drain electrode 6B provided on the ESL 5 and respectively at both sides thereof, a passivation layer (PVX) 7 provided on the source electrode 6A and the drain electrode 6B, a resin layer (a planarization layer) 8 provided on the PVX 7, an anode 9 provided on the resin layer 8 and electrically connected to the drain electrode 6B through a via, an organic light emitting layer 11 and a pixel definition layer (PDL) 12 provided on the anode 9, and a cathode 10 provided on the organic light emitting layer 11 and the PDL 12.

The OLED display device further comprises a second substrate 13 disposed opposite to the first substrate, a λ/2-wave plate 14A, a λ/4-wave plate 14B and a planarization layer 15 successively provided and laminated on the inner side of the second substrate 13, and a polarizer 16 provided on the outer side of the second substrate 13 and comprising a light absorption layer 16A. In addition, the polarizer 16 further comprises a cellulose triacetate (TAC) layer 16B.

In practical application, in a case where the external light is incident into the display device in different directions, the lengths and the widths of the wave plate and the light absorption layer of the polarizer may be determined based on the light reflection principle and the light refraction principle.

Hereafter, it will describe how to determine the lengths and the widths of the wave plate and the light absorption layer according to an exemplary embodiment of the present invention.

Second Embodiment

Figure 3:
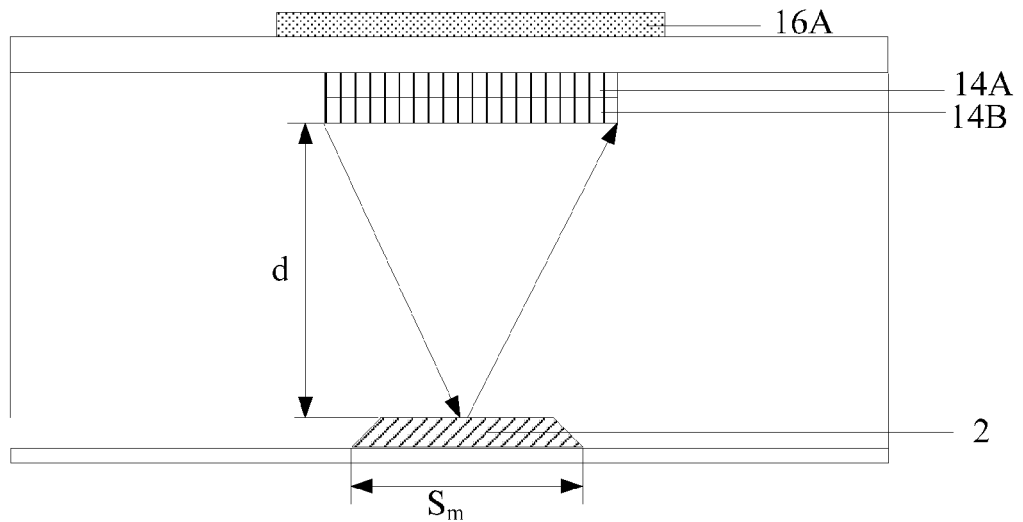
FIG. 3 is a top view of an array substrate according to an exemplary embodiment of the present invention.

In order to simplify the calculation, please be noted that in the second embodiment of the present invention the gate electrode is regarded as the metal pattern, and the OLED display device has the configuration as shown in FIG. 3. In the second embodiment, it is described how to determine the lengths and the widths of the wave plate and the light absorption layer of the polarizer, wherein the size of the gate electrode in a direction parallel to the gate line is set as the width size the gate electrode.

1. Determining the width of the wave plate

As shown in FIG. 3, the λ/4-wave plate 14B, the λ/2-wave plate 14A and the light absorption layer 16A of the polarizer are located just above the gate electrode 2.

If given that the incident angle of the external light radiated on the gate electrode 2 is set to $\theta \in (0°, 90°)$, according to the law of tangents, the width of the wave plate may be obtained according to following expression:

$$S = \Delta S + S_m \quad (1)$$

Wherein, S is the width of the wave plate, $S_m$ is the width of the gate electrode, $\Delta S \approx 2*d/\tan \theta$, and d is a distance between the gate electrode and the wave plate.

For example, θ is equal to 60°, d is equal to 5 microns, the width of the gate electrode is equal to 5 microns, and the width of the λ/2-wave plate and the λ/4-wave plate may be calculated as: $S = S_m + \Delta S = 5 + 5.8 = 10.8$ microns.

2. Determining the width of the light absorption layer.

Figure 4:
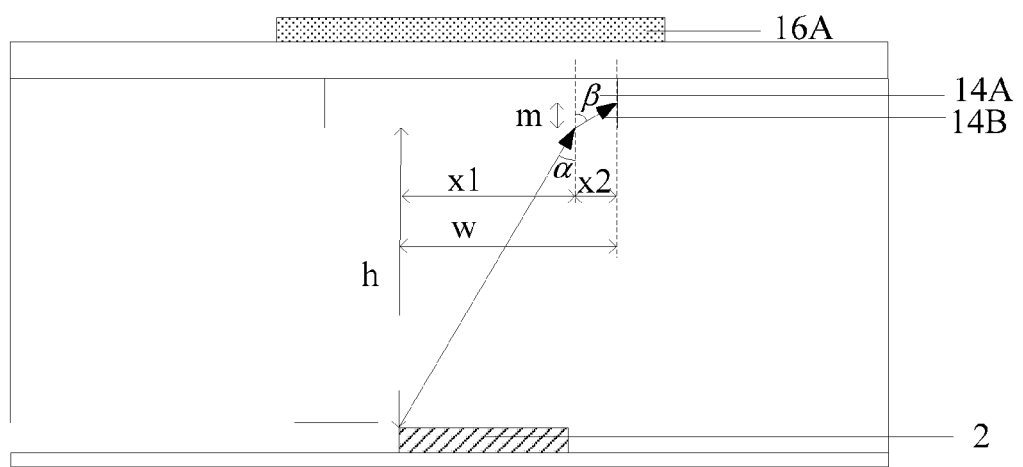
FIG. 4 is another illustrative view of an array substrate according to an exemplary embodiment of the present invention.

As shown in FIG. 4, the λ/4-wave plate 14B, the λ/2-wave plate 14A and the light absorption layer 16A of the polarizer are located just above the gate electrode 2.

Based on FIG. 4, following expressions may be obtained.

$$\tan\alpha = \frac{x1}{h} \quad (2)$$

$$\tan\beta = \frac{x2}{m} \quad (3)$$

$$x1 + x2 = w \quad (4)$$

$$\frac{\sin\alpha}{\sin\beta} = \frac{n2}{n1} \quad (5)$$

Wherein, n1 is a refractive index of a medium at side of a refraction angle, n2 is a refractive index of a medium at side of an incidence angle, w, h, m, n1 and n2 are all known. Thereby, α and β may be approximately calculated based on the above four expressions (expression (2) to expression (5)).

According to the expression (5), a difference between the width of the light absorption layer and the width of the λ/4-wave plate and the λ/2-wave plate may be finally obtained, and then the width of the light absorption layer may be finally obtained.

Figure 5:
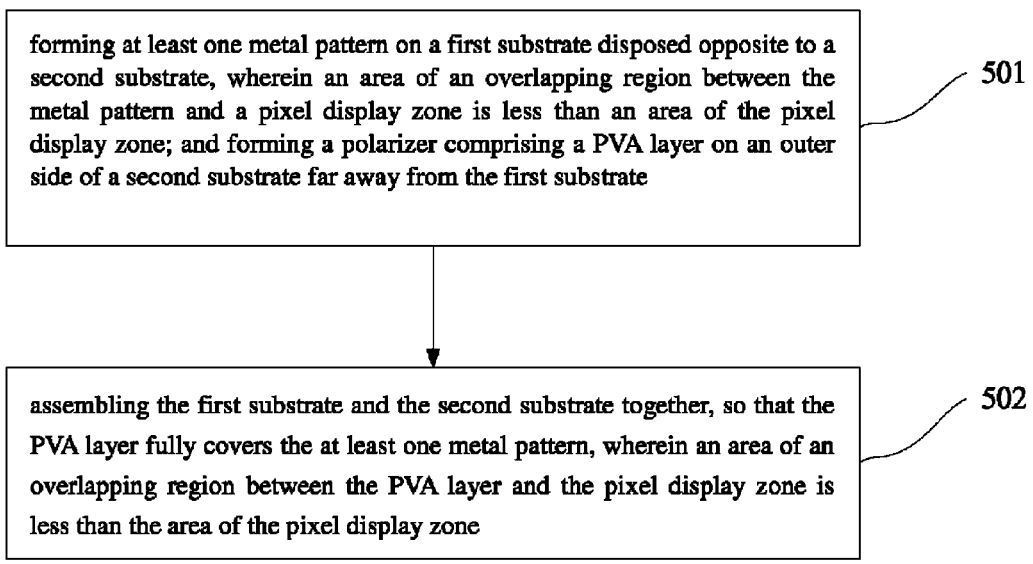
FIG. 5 is a flow chart of a method according to an exemplary embodiment of the present invention.

Preferably, as shown in FIG. 5, in an embodiment of the present invention, there is provided a method of manufacturing the display device, comprising steps of:

Step 501: forming at least one metal pattern on a first substrate disposed opposite to a second substrate, wherein an area of an overlapping region between the metal pattern and a pixel display zone is less than an area of the pixel display zone; and forming a polarizer, comprising a light absorption layer on an outer side of the second substrate far away from the first substrate; and Step 502: assembling the first substrate and the second substrate together, so that the light absorption layer fully covers the at least one metal pattern, wherein an area of an overlapping region between the light absorption layer and the pixel display zone is less than the area of the pixel display zone.

Preferably, the method may further comprising a step of:

forming a wave plate on an inner side of the second substrate, so that the wave plate fully covers the at least one metal pattern, and the polarizer fully covers the wave plate, after the first substrate and the second substrate are assembled together, wherein an area of an overlapping region between the wave plate and the pixel display zone is less than the area of the pixel display zone.

Preferably, the method may further comprising a step of:

forming a planarization layer for packaging the wave plate after forming the wave plate.

In practical application, compared with the process of attaching the polarizer in the prior art, the process of attaching the polarizer in the embodiment of the present invention needs to be performed in higher control precision.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A display device, comprising:
   a first substrate formed with at least one metal pattern thereon;
   a second substrate disposed opposite to the first substrate; and
   a polarizer provided on an outer side of the second substrate distant from the first substrate,
   wherein an area of an overlapping region between the metal pattern and a pixel display zone is less than an area of the pixel display zone,
   wherein the polarizer comprises a light absorption layer fully covering the at least one metal pattern, and
   wherein an area of an overlapping region between the light absorption layer of the polarizer and the pixel display zone is less than the area of the pixel display zone.

2. The display device according to claim 1, wherein the display device comprises a wave plate disposed on the outer side or an inner side of the second substrate and located below the polarizer.

3. The display device according to claim 2,
   wherein the wave plate fully covers the at least one metal pattern, and the polarizer fully covers the wave plate; and
   wherein an area of an overlapping region between the wave plate and the pixel display zone is less than the area of the pixel display zone.

4. The display device according to claim 3, wherein the wave plate is disposed on the inner side of the second substrate, and the display device further comprises a planarization layer for packaging the wave plate.

5. The display device according to claim 3, wherein the wave plate comprises a half-wavelength ($\lambda/2$) wave plate and a quarter-wavelength ($\lambda/4$) wave plate.

6. The display device according to claim 1, wherein the light absorption layer is made of polyvinyl alcohol.

7. The display device according to claim 6, wherein the polarizer further comprises a cellulose triacetate layer which is completely coincided with the light absorption layer.

8. The display device according to claim 1, wherein the metal pattern comprises at least one of gate lines, data lines, gate electrodes, source electrodes and drain electrodes.

9. The display device according to claim 1, wherein the display device has a pixel size less than a preset size threshold, and the light absorption layer is not overlapped with the pixel display zone.

10. The display device according to claim 9, wherein the display device comprises an Organic Light-Emitting Diode (OLED) display device.

11. The display device according to claim 1, wherein the metal pattern is not overlapped with the pixel display zone, is partly overlapped with the pixel display zone, or is completely overlapped with the pixel display zone.

12. The display device according to claim 11, wherein the metal pattern is completely overlapped with the pixel display zone, and an area of the metal pattern is less than the area of the pixel display zone.

13. The display device according to claim 1, wherein the light absorption layer of the polarizer is not overlapped with the pixel display zone, is partly overlapped with the pixel display zone, or is completely overlapped with the pixel display zone.

14. The display device according to claim 13, wherein the light absorption layer of the polarizer is completely overlapped with the pixel display zone, and an area of the light absorption layer of the polarizer is less than the area of the pixel display zone.

15. A method of manufacturing a display device, comprising steps of:
   forming at least one metal pattern on a first substrate, wherein an area of an overlapping region between the metal pattern and a pixel display zone is less than an area of the pixel display zone;
   forming a polarizer on an outer side of a second substrate distant from the first substrate, wherein the polarizer comprises a light absorption layer; and
   assembling the first substrate and the second substrate together, so that the light absorption layer fully covers the at least one metal pattern, wherein an area of an overlapping region between the light absorption layer and the pixel display zone is less than the area of the pixel display zone.

16. The method according to claim 15, further comprising:
   forming a wave plate on an inner side of the second substrate, so that the wave plate fully covers the at least one metal pattern, and the polarizer fully covers the wave plate, after the first substrate and the second substrate are assembled together,
   wherein an area of an overlapping region between the wave plate and the pixel display zone is less than the area of the pixel display zone.

17. The method according to claim 16, further comprising:
   forming a planarization layer for packaging the wave plate after forming the wave plate.

18. The method according to claim 17, wherein the wave plate comprises a half-wavelength (λ/2) wave plate and a quarter-wavelength (λ/4) wave plate.

19. The method according to claim 15, wherein the metal pattern comprises at least one of gate lines, data lines, gate electrodes, source electrodes and drain electrodes.

20. The method according to claim 15, wherein the display device comprises an Organic Light-Emitting Diode (OLED) display device.

* * * * *